(12) United States Patent
Choi et al.

(10) Patent No.: US 7,361,612 B2
(45) Date of Patent: Apr. 22, 2008

(54) BARRIER COATING COMPOSITIONS CONTAINING SILICON AND METHODS OF FORMING PHOTORESIST PATTERNS USING THE SAME

(75) Inventors: Sang-Jun Choi, Seoul (KR); Mitsuhiro Hata, Suwon-si (KR); Han-Ku Cho, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 106 days.

(21) Appl. No.: 11/447,932

(22) Filed: Jun. 7, 2006

(65) Prior Publication Data

US 2007/0048672 A1 Mar. 1, 2007

(30) Foreign Application Priority Data

Aug. 26, 2005 (KR) .................. 10-2005-0078724

(51) Int. Cl.
*H01L 21/469* (2006.01)
(52) U.S. Cl. ............ 438/780; 438/708; 438/725; 257/E21.259; 257/E21.584; 106/14.05
(58) Field of Classification Search ............ 438/496, 438/708; 257/E21.024, E21.492; 106/287.12
See application file for complete search history.

(56) References Cited

U.S. PATENT DOCUMENTS

| | | | | |
|---|---|---|---|---|
| 6,500,553 | B1 * | 12/2002 | Yoneda et al. | 428/448 |
| 2005/0277302 | A1 * | 12/2005 | Nguyen et al. | 438/763 |
| 2007/0212886 | A1 * | 9/2007 | Uh et al. | 438/706 |

FOREIGN PATENT DOCUMENTS

| | | |
|---|---|---|
| JP | 2004-325466 | 11/2004 |
| JP | 2005-099648 | 4/2005 |
| JP | 2005-109146 | 4/2005 |

\* cited by examiner

OTHER PUBLICATIONS

Ralph R. Dammel et al., *193 nm Immersion Lithography—Taking the Plunge*, J. of Photopolymer Science and Technology, 2004, vol. 17, No. 4, pp. 587-602.

*Primary Examiner*—Michael Lebentritt
*Assistant Examiner*—Cheung Lee
(74) *Attorney, Agent, or Firm*—Harness, Dickey & Pierce, P.L.C.

(57) ABSTRACT

Provided are example embodiments of the invention including a range of polymer structures suitable for incorporation in barrier compositions for use, for example, in immersion photolithography in combination with a suitable solvent or solvent system. These polymers exhibit a weight average molecular weight (Mw) of 5,000 to 200,000 daltons and may be generally represented by formula I:

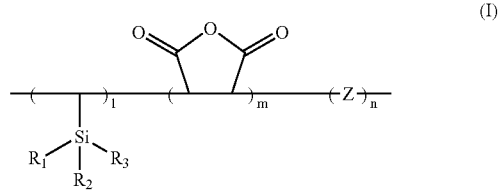

wherein the expressions $(1+m+n)=1$; $0.1 \leq (1/(1+m+n)) \leq 0.7$; $0.3 \leq (m/(1+m+n)) \leq 0.9$; and $0.0 \leq (n/(1+m+n)) \leq 0.6$ are satisfied; $R_1$, $R_2$ and $R_3$ are $C_1$ to $C_5$ alkyl, $C_1$ to $C_5$ alkoxy and hydroxyl groups; and Z represents an alkene that includes at least one hydrophilic group. Barrier coating compositions will include an organic solvent or solvent system selected from $C_3$ to $C_{10}$ alcohol-based organic solvents, $C_4$ to $C_{12}$ alkane-based organic solvents and mixtures thereof.

22 Claims, 6 Drawing Sheets

FIG. 2

| DOSE (mJ/cm$^2$) | 21 | 22 | 23 | 24 | 25 | 26 | 27 |
|---|---|---|---|---|---|---|---|
| L/S PATTERN | | | | | | | |
| LINE WIDTH (nm) | 126.1 | 112.6 | 101.4 | 91.4 | 72.1 | 82.1 | 64.9 |

FIG. 3

| DOSE (mJ/cm²) | 21 | 22 | 23 | 24 | 25 | 26 | 27 |
|---|---|---|---|---|---|---|---|
| L/S PATTERN | | | | | | | |
| LINE WIDTH (nm) | 143.6 | 124.2 | 112.8 | 100.1 | 88.9 | 78.8 | 71.8 |

BARRIER COATING COMPOSITIONS CONTAINING SILICON AND METHODS OF FORMING PHOTORESIST PATTERNS USING THE SAME

PRIORITY STATEMENT

This application claims priority under 35 U.S.C. § 119 from Korean Patent Application No. 10-2005-0078724, which was filed on Aug. 26, 2005, in the Korean Intellectual Property Office, the disclosure of which is incorporated herein, in its entirety, by reference.

BACKGROUND OF THE INVENTION

1. Field of the Invention

Embodiments of the invention include polymeric compounds, and compositions including such compounds, that may be used in forming barrier coating layers for protecting underlying photoresist compositions and methods of utilizing such compounds and compositions. For example, compounds and compositions according to example embodiments of the invention may be used in manufacturing semiconductor integrated circuits, particularly with respect to methods for forming photoresist layers and patterns having a barrier coating layer that will improve the performance of the photoresist in, for example, immersion photolithography.

2. Description of the Related Art

In fabrication processes for manufacturing semiconductor devices, photolithographic processes are used repeatedly to form a wide variety of patterns. The smallest lines and spaces that can be formed using a particular photolithographic process are limited, to some degree, by the wavelength of the light used to expose the pattern. For example, line patterns on the order of about 60 nm represent a lower limit to the patterns that can be produced using a conventional ArF laser (193 nm) light source.

Immersion photolithography processes have been suggested as alternatives to the conventional lithographic processes that can overcome the wavelength limitations associated with the conventional use of ArF laser light sources. In immersion photolithography processes, the gap or space formed between a lens and the wafer surface is filled with liquid that enhances the system performance.

In photolithography processes, the numeral aperture (NA) of an exposure system can be calculated from the equation:

$$NA = n\ \mathrm{Sin}(a)$$

in which n is the refractive index (RI) of an immersion medium and $\alpha$ is the angle between the optical axis of the system and light entering an object lens farthest from the optical axis. In general, a larger NA and/or a light source having a shorter wavelength will tend to improve the resolution that can be obtained by the imaging system. Because the immersion medium used in immersion photolithography tends to increase the NA to a value greater than 1, for example, achieving NA values greater than or equal to 1.3, the resolution of is increased. In particular, when $H_2O$ is used as the immersion medium, improved resolution and improved depth of focus (DOF) can be achieved when compared with a conventional "dry" photolithographic process using can be attained because the refractive index, n, of water is 1.44.

However, using $H_2O$ as an immersion liquid can lead to several problems including, for example, the tendency of photoresist components such as photoacid generators (PAG) and/or bases to leach into water from the photoresist, thereby compromising the performance of the photoresist and/or contaminating the lens. One method for addressing this problem involves forming a barrier coating layer on the photoresist as disclosed in, for example, by R. R. Dammel et al. in *J. Photopol. Sci. Tech.*, 587, 4 (2004), the disclosure of which is hereby incorporated, in its entirety, by reference. The top coating or barrier coating layer prevents or reduces contact and transfer between the immersion medium and the photoresist, thus preventing or reducing the likelihood that one or more of the photoresist components will be leached from the photoresist layer.

Barrier coating compositions for use in immersion photolithography processes should exhibit relatively low solubility in the immersion medium for at least the duration of the exposure process, exhibit relatively low absorbance at the wavelength of the exposure light source, exhibit relatively good solubility in a developing solution after being exposed, and should exhibit no more than minor intermixing with the photoresist layer to which it is applied.

SUMMARY OF THE INVENTION

Example embodiments of the invention include barrier compositions that exhibit reduced aqueous solubility, exhibit little, if any, intermixing with photoresist compositions when applied to the surface of a photoresist layer, exhibit relatively low absorbance at the UV wavelengths used for exposing the photoresist layer and are readily soluble in developing solutions after being exposed during an immersion photolithography process. As used herein, the term readily soluble is intended to encompass materials that can be substantially completely removed from the surface of the substrate during a developing operation that includes exposing a layer of the material to a conventional removing solution or developing solution, for example, water or an aqueous alkaline solution of 2.38 wt % TMAH, for a relatively brief period, for example 30 to 60 seconds. As will be appreciated by those skilled in the art, however, a number of variables, for example, the thickness of the layer, previous heat treatment of the layer, the temperature of the developing solution and/or the application rate of the developing solution may affect the rate at which the material is removed from the substrate and hence the development time required.

Example embodiments of the invention also include methods of forming photoresist layers suitable for use in immersion photolithography processes for producing fine patterns exhibiting good pattern profiles can be formed with a simple and economical manufacturing process.

Example embodiments of the invention also include a range of polymer structures suitable for incorporation in the barrier compositions in combination with a suitable solvent or solvent system. These polymers exhibit a weight average molecular weight (Mw) of 5,000 to 200,000 daltons and may be generally represented by formula I:

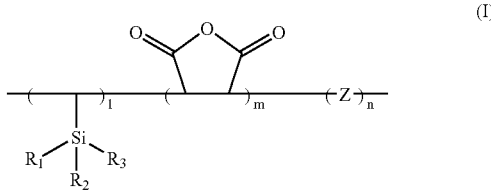

(I)

wherein the expressions $(1+m+n)=1$; $0.1 \leq (1/(1+m+n)) \leq 0.7$; $0.3 \leq (m/(1+m+n)) \leq 0.9$; and $0.0 \leq (n/(1+m+n)) \leq 0.6$ are satisfied; and wherein $R_1$, $R_2$ and $R_3$ are independently selected from $C_1$ to $C_5$ alkyl, $C_1$ to $C_5$ alkoxy and hydroxyl groups; and Z represents at least one alkene monomer that includes at least one hydrophilic group, for example, an alcohol group or an acid group, such as a carboxy group or a sulfonic group. Z may be, for example, one or more (meth)acrylates, cycloalkenes or (meth)acrylic acids, such as, for example, 2-hydroxyethyl (meth)acrylate, allyl alcohol and/or 5-norbornene-2-methanol. The polymers may also be characterized by a polydispersity of no greater than 3, but polymers having higher degrees of polydispersity may still exhibit satisfactory performance. For example, a polymer in which the first monomer comprises vinyltrimethyl silane and accounts for 30% to 50% of the monomer units, i.e., $0.3 \leq (1(1+m+n)) \leq 0.5$ may be preferred.

Example embodiments of the invention include barrier coating compositions in which the organic solvent or solvent system may be selected from a group consisting of $C_3$ to $C_{10}$ alcohol-based organic solvents, $C_4$ to $C_{12}$ alkane-based organic solvents or a mixture of one or more $C_3$ to $C_{10}$ alcohol-based organic solvents and/or one or more a $C_4$ to $C_{12}$ alkane-based organic solvents.

Example embodiments of the invention also include methods of forming photoresist patterns, which will typically include forming a photoresist layer on a substrate; hardening the photoresist layer, for example, by performing a soft-bake process; forming a barrier coating layer by applying a barrier coating composition according to the invention to the surface of the photoresist layer. The barrier coating composition will include at least one polymer and at least one organic solvent, wherein the polymer(s) may be generally represented by formula I:

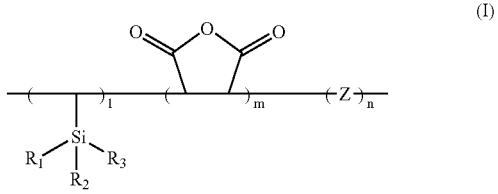

(I)

wherein the expressions $(1+m+n)=1$; $0.1 \leq (1/(1+m+n)) \leq 0.7$; $0.3 \leq (m/(1+m+n)) \leq 0.9$; and $0.0 \leq (n/(1+m+n)) \leq 0.6$ are satisfied; and further wherein $R_1$, $R_2$ and $R_3$ are independently selected from a group consisting of $C_1$ to $C_5$ alkyl, $C_1$ to $C_5$ alkoxy and hydroxyl groups and mixtures thereof; and Z is an alkene monomer that includes at least one hydrophilic group; exposing a region of the photoresist layer through a liquid medium applied to the barrier coating layer; performing a post-exposure bake (PEB) or post-exposure treatment of the exposed photoresist layer; removing the barrier coating layer; and developing the exposed photoresist layer to obtain the photoresist pattern. Both the photoresist layer and the barrier coating layer may be formed using a conventional spin-coating process, followed by a bake or other treatment to solidify and/or harden the applied composition.

The barrier coating layer can be removed and the exposed photoresist layer can be developed in a single process during which a developing solution, for example an aqueous alkaline solution, is applied to the substrate. Although the polymers according to the invention are generally insoluble in water and aqueous solutions having a pH of about 7 or less, the hydrophilic portions incorporated into the polymers will allow the polymers to be dissolved in alkaline solutions, such as a conventional developing solution. As the barrier coating layer is removed, the developing solution can reach the exposed photoresist layer and remove regions of the photoresist, e.g., the exposed portions of a positive photoresist, to form the desired photoresist pattern.

Example embodiments of the invention include methods of fabricating semiconductor devices in which a barrier coating layer is formed from a barrier coating composition that including one or more polymer having silicon-containing monomers. The barrier coating layer protects an underlying photoresist layer during immersion photolithography by suppressing or preventing dissolution of photoresist components into the liquid medium during the exposure process and exhibits little, if any, intermixing with the underlying photoresist layer.

Barrier coating layers formed using barrier coating compositions according to example embodiments of the invention also exhibit good solubility in aqueous alkaline solutions, for example, conventional photoresist developing solutions and can, therefore, be removed during the post-exposure developing process. Accordingly, barrier coating compositions incorporating silicon containing polymers according to the invention are expected to be particularly useful in forming photoresist patterns used in immersion photolithography processes for achieving fine photoresist patterns that exhibit good resist profiles and allow manufacturing costs to be reduced through the use of less expensive barrier coating layer compositions and/or the relative simplicity with which the barrier coating layers can be both formed and removed.

BRIEF DESCRIPTION OF THE DRAWINGS

The invention will become more apparent by describing in detail example embodiments thereof with reference to the attached drawings in which:

FIG. 2 shows scanning electron microscopy (SEM) images of line and space (L/S) patterns achieved using various exposure doses using a method according to an example embodiment of the invention;

FIG. 3 shows SEM images of L/S patterns of various doses, according to another example embodiment of the invention.

Figure 1A:
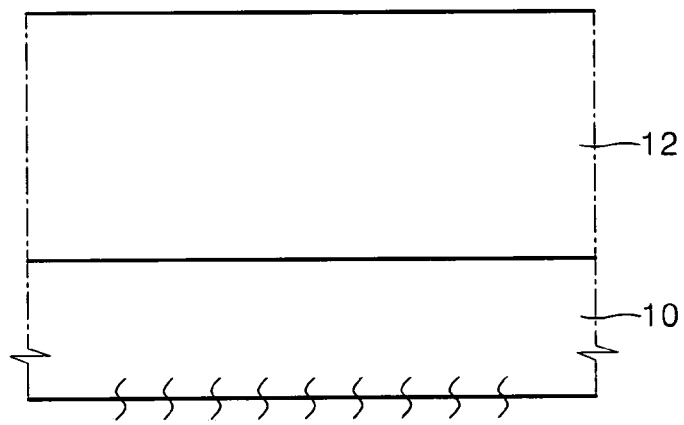
FIGS. 1A through 1E are cross-sectional views illustrating a method of forming a photoresist pattern according to an example embodiment of the invention.

These drawings have been provided to assist in the understanding of the example embodiments of the invention as described in more detail below and should not be construed as unduly limiting the invention. In particular, the relative spacing, positioning, sizing and dimensions of the various elements illustrated in the drawings are not drawn to scale and may have been exaggerated, reduced or otherwise modified for the purpose of improved clarity.

Those of ordinary skill will appreciate that certain of the various monomers, polymers, barrier coating compositions and barrier coating processes as illustrated or described with respect to the example embodiments may be selectively and independently modified and/or combined to create other monomers, polymers, barrier coating compositions and barrier coating processes useful for manufacturing semiconductor devices without departing from the scope and spirit of this disclosure.

DETAILED DESCRIPTION OF EXAMPLE EMBODIMENTS

A barrier coating composition according to an example embodiment of the invention may be used to form a barrier coating layer which prevents or suppresses the leaching of photoresist components from the photoresist layer into the immersion medium during immersion photolithography wafer processing. Barrier coating compositions according to example embodiments of the invention may be used to form barrier coating layers on underlying photoresist layers. Barrier coating compositions according to example embodiments of the invention include one or more polymers having a weight average molecular weight (Mw) of 5,000 to 200,000 daltons and an organic solvent. The structure of polymers according to example embodiments of the invention may be expressed by formula I:

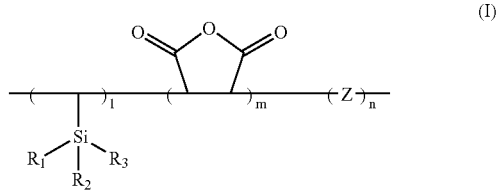

(I)

wherein the expressions $(l+m+n)=1$; $0.1 \leq (l/(l+m+n)) \leq 0.7$; $0.3 \leq (m/(l+m+n)) \leq 0.9$; and $0.0 \leq (n/(l+m+n)) \leq 0.6$ are satisfied; and wherein $R_1$, $R_2$ and $R_3$ are independently selected from a group consisting of $C_1$ to $C_5$ alkyl groups, for example, methyl and ethyl groups, $C_1$ to $C_5$ alkoxy groups, for example methoxy and ethoxy groups, and a hydroxyl group; and Z is an alkene monomer that includes at least one hydrophilic group.

As will be appreciated by those skilled in the art, certain of the "monomers" may, in fact, include a number of the compounds encompassed by the general formula for that monomer. For example, the polymer could include as a first "monomer" a combination of various silane monomers in which the $R_1$, $R_2$ and $R_3$ groups correspond to more than one group as suggested in the formula below:

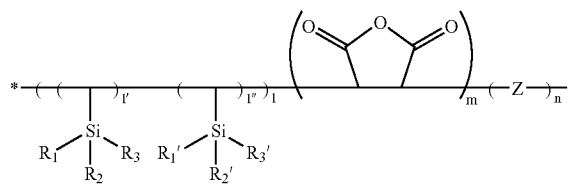

-continued

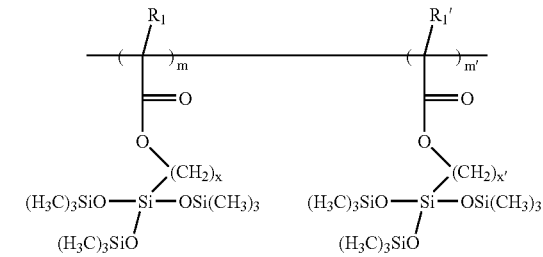

wherein $l'+l''=1$, and wherein at least one of $R_1'$, $R_2'$ and $R_3'$ is different than the corresponding $R_1$, $R_2$ and $R_3$ and wherein all of the groups are selected from $C_1$ to $C_5$ alkyl groups, for example, methyl and ethyl groups, and $C_1$ to $C_5$ alkoxy groups. As will be appreciated by those skilled in the art, the composition of the first monomer can include additional species of the basic monomer as suggested by the formula:

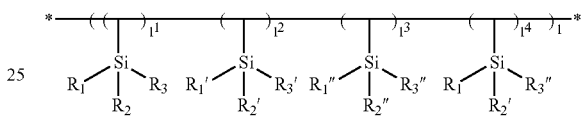

wherein $l^1+l^2+l^3+l^4=1$. As will be appreciated by those skilled in the art, many other combinations of discrete monomers falling within the definition of the first monomer may be combined to from a composite first polymer and thereby provide an additional degree of control over the properties and performance of the resulting polymer and compositions that incorporate such polymers. Further, those skilled in the art will, accordingly, appreciate that other combinations including a variety of monomers falling within the general formulas illustrated above may comprise the first and third "monomers" respectively. The alkene monomer Z may be optionally incorporated for increasing the solubility of barrier coating layers formed from barrier coating compositions according to the example embodiments of the invention when exposed to, for example, alkaline developing solutions. If present, the alkene monomer Z will include at least one hydrophilic group, for example, an alcohol group or an acid group, such as a carboxy group and a sulfonic group. For example, Z may be a monomer selected from a group consisting of (meth)acrylates, alkenes, cycloalkenes and (meth)acrylic acids, such as 2-hydroxyethyl (meth)acrylate, allyl alcohol, and 5-norbornene-2-methanol.

The barrier coating compositions according to example embodiments of the invention include an organic solvent or organic solvent system suitable for dissolving the polymer(s). The organic solvent may be one or more alcohol-based organic solvents, one or more alkane-based organic solvents or a mixture including at least one alcohol-based organic solvent and at least one alkane-based organic solvent.

For example, $C_3$ to $C_{10}$ alcohol-based organic solvents, $C_4$ to $C_{12}$ alkane-based organic solvents, or a mixture of the one or more $C_3$ to $C_{10}$ alcohol-based organic solvent(s) and/or one or more $C_4$ to $C_{12}$ alkane-based organic solvent(s) may be used as the organic solvent component in barrier coating compositions according to example embodiments of the invention. Minor amounts of alkanes, nitryls, and/or ethers can also be incorporated into an organic solvent system, for example, an alcohol-based organic solvent, if desired. In addition, one or more fluorine-based surfactants and/or silicon-based surfactants, including ionic and/or non-ionic surfactants, and/or viscosity modifiers may be incorporated into the barrier coating composition for improving processability and/or the uniformity of the barrier coating layers formed from such barrier coating compositions.

When a mixture of an alcohol-based organic solvent and an alkane-based organic solvent is used as an organic solvent in a barrier coating composition according to an example embodiment of the invention, the amount of the alkane-based-organic solvent may be less than about 30% by weight based on the total weight of the organic solvent. The alcohol-based organic solvents suitable for use in barrier coating compositions according to the invention are expected to include isopropyl alcohol and 4-methyl-2-pentanol and the alkane-based solvents are expected to include nonane and decane.

As discussed above, fine photoresist patterns may be obtained using immersion photolithography in which an immersion medium is utilized to raise the effective numerical aperture (NA) of an exposure system. When forming a photoresist pattern using the immersion photolithography, a barrier coating layer formed on a photoresist layer using a barrier coating composition according to an example embodiment of the invention will prevent or suppress the leaching of the photoresist components into the a liquid medium, for example, water.

An example embodiment of a method of forming a photoresist pattern using a barrier coating composition according to an example embodiment of the invention will be described below. FIG. 1A through 1E are cross-sectional views illustrating a method of forming a photoresist pattern according to an example embodiment of the invention. As illustrated in FIG. 1A, a photoresist layer 12 is formed on a semiconductor substrate 10. The photoresist layer 12 may be formed of a conventional chemically amplified resist composition containing a photo acid generator (PAG). The chemically amplified resist composition may be a resist composition tailored for exposure using a KrF excimer laser (248 nm), an ArF excimer laser (193 nm), or a $F_2$ excimer laser (157 nm). In addition, the photoresist layer 12 may be formed of a positive resist composition or a negative resist composition. The photoresist layer 12 formed on the semiconductor substrate 10 will also typically be subjected to a soft bake at a temperature of about 105° C. to 130° C. to harden the photoresist layer before subsequent processing.

Figure 1B:
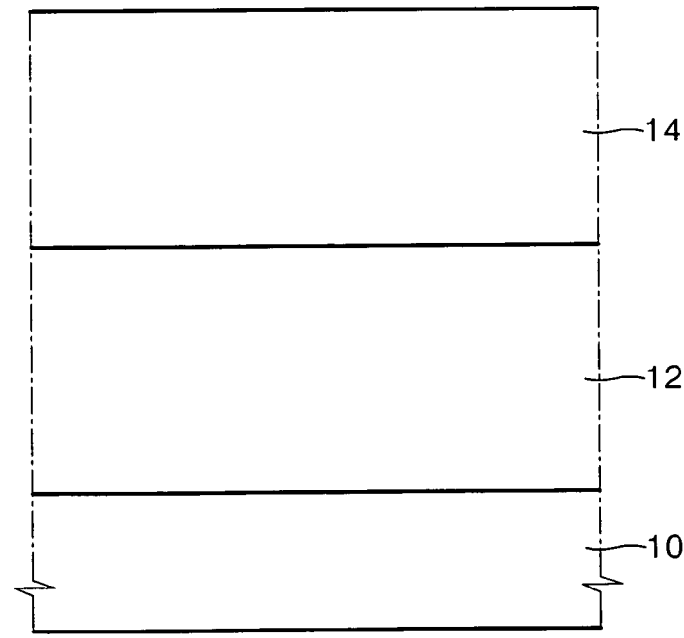

As illustrated in FIG. 1B, a barrier coating composition according to an example embodiment of the invention is then deposited on and spread across the upper surface of photoresist layer 12 by, for example, spin-coating, to form a barrier coating composition layer 14. If a spin-coating method is utilized to form the barrier coating layer, the spin-coating operation may be performed with parameters of 500 to 3000 rpm and for a duration of 30 to 90 seconds to form a barrier coating layer 14 having the desired average thickness and desired uniformity. Those skilled in the art will, for example, be able to select spin-coating parameters of, for example, 1500 to 2500 rpm for 30 to 90 seconds, suitable for achieving a substantially defect-free and sufficiently uniform barrier coating composition layer 14.

Figure 1C:
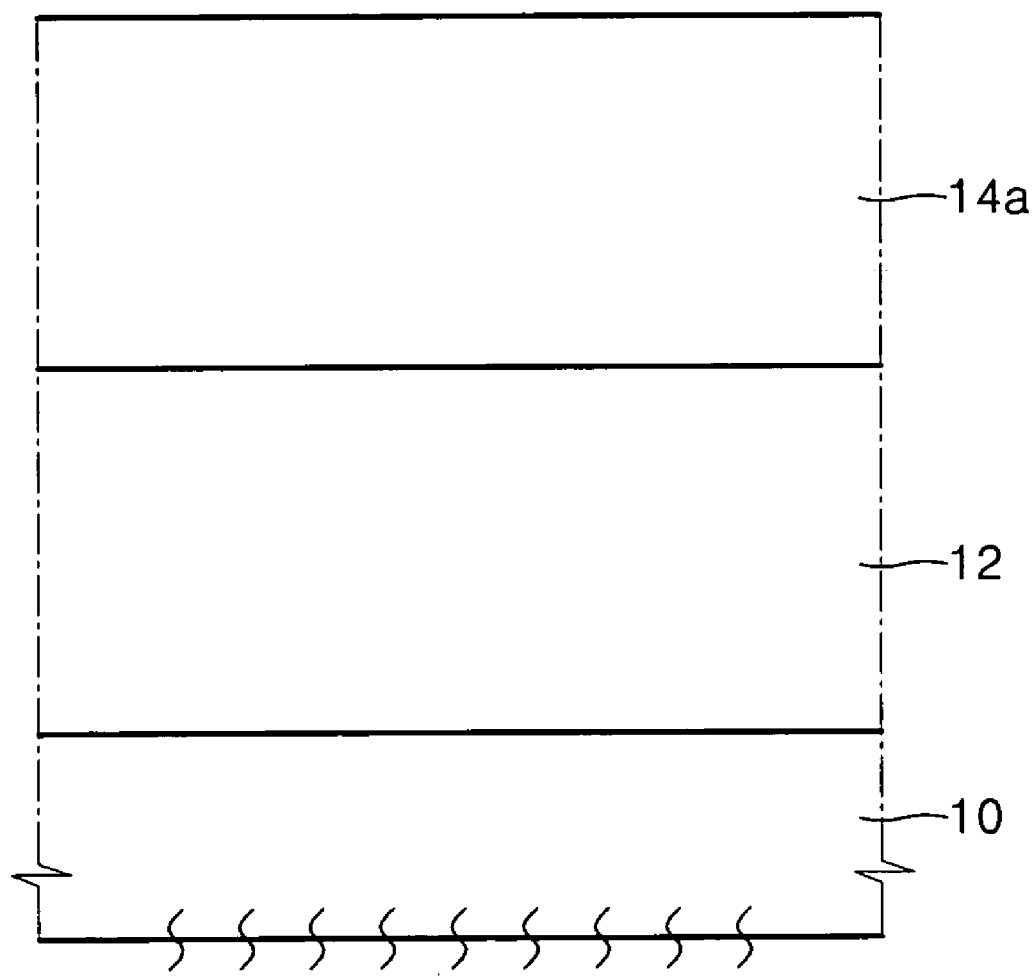

As illustrated in FIG. 1C, the barrier coating composition layer 14 may then be heat-treated, or cured or processed in some other manner suitable for the layers being processed, to form a barrier coating layer 14a. As used herein, a composition will be considered water-insoluble when less than 0.5 grams of the composition will dissolve in 100 milliliters of water at 25° C. The heat treatment performed at a temperature between about 95° C. to 120° C. is expected to be suitable for compositions according to the invention.

Figure 1D:
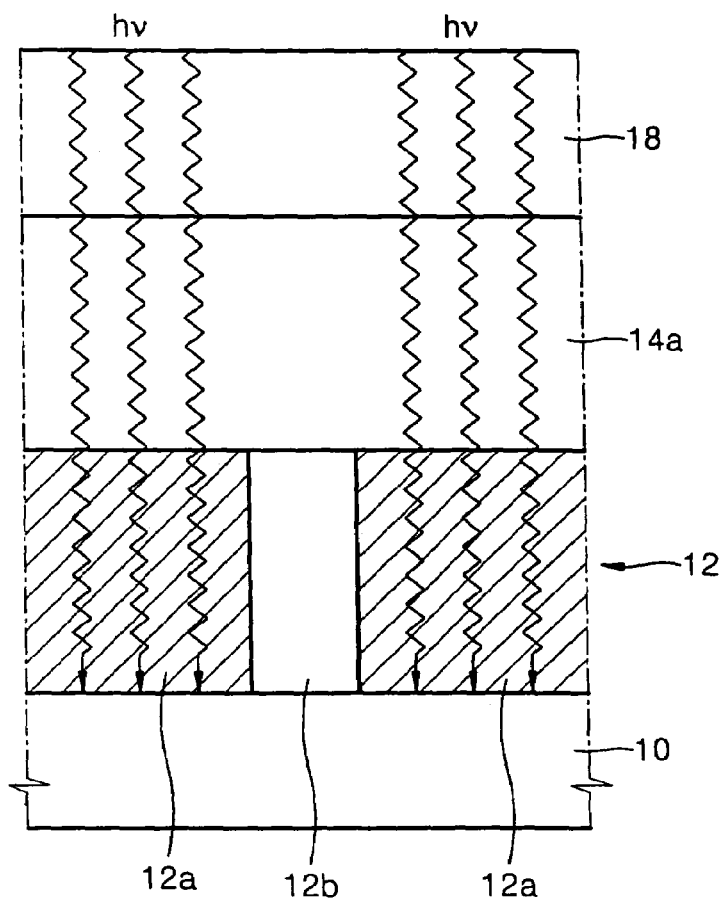

As illustrated in FIG. 1D, a portion of the photoresist layer 12 is exposed to light energy passing through the barrier coating layer 14a and a liquid medium 18 provided on the barrier coating layer between the light source, for example, an ArF excimer laser (193 nm), and the photoresist layer. After the exposure, the photoresist layer 12 will comprise an exposed region 12a and a non-exposed region 12b.

The liquid medium 18 may include, for example, water. In this case, the barrier coating layer 14a interposed between the photoresist layer 12 and the liquid medium 18 prevents or suppresses the leaching of photoresist components from the underlying photoresist layer 12 into the liquid medium 18. As will be appreciated, immersion photolithography using an aqueous solution having a pH other than approximately 7 or a non-aqueous solvent as the liquid medium will necessitate the use of a barrier coating layer that is reformulated to be at least relatively insoluble in the liquid medium of choice.

Figure 1E:
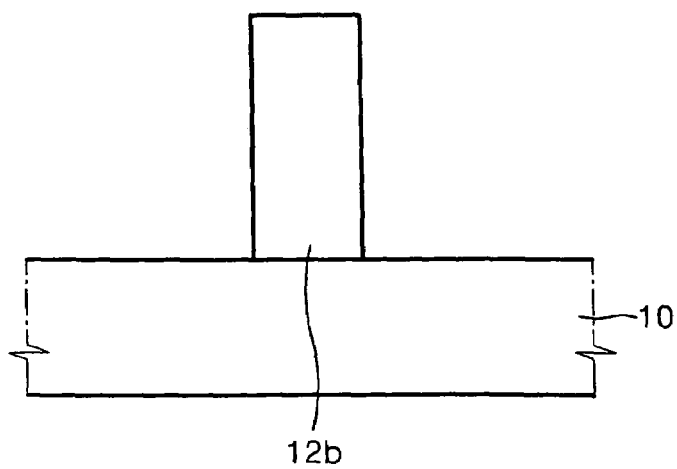

As illustrated in FIG. 1E, the exposed photoresist layer 12 may then be subjected to post-exposure baking (PEB) process after which the barrier coating layer 14a is removed and the exposed photoresist layer 12 is developed. The barrier coating layer 14a formed from a barrier coating composition according to example embodiments of the invention will exhibit much greater solubility in an alkaline developing solution than in water. Accordingly, it may be unnecessary to perform a separate process for removing the barrier coating layer 14a before developing the exposed photoresist layer 12 as the barrier coating layer can be removed during the initial stages of the development process. The alkaline developing solution may be, for example, a 2.38% tetramethylamonium hydroxide (TMAH) solution or another conventional developing solution.

During the developing process, the barrier coating layer 14a and the exposed region(s) 12a of the photoresist layer 12 are removed, leaving a photoresist pattern comprising the unexposed region(s) 12b of the photoresist layer 12 on the semiconductor substrate 10. As illustrated, when the photoresist layer 12 is formed from a positive resist composition, only the non-exposed region 12b remains on the semiconductor substrate 10, as illustrated in FIG. 1E. However, as will be appreciated by those skilled in the art, if the photoresist layer 12 was formed from a negative resist composition, only the exposed region(s) 12a would remain on the semiconductor substrate 10 (not shown) after developing the photoresist pattern.

In addition to the detailed explanation provided above and as illustrated in FIGS. 1A-1E, certain example embodiments and comparative data are provided below to amplify the detailed description and provide certain representative examples whereby the scope and application of the invention may be more fully appreciated. As will be appreciated by those skilled in the art, the inventions described herein may be embodied in many different forms and should not be construed as being limited to the example embodiments set forth herein. These embodiments are provided so that this disclosure will provide a thorough and complete description of the inventions and will fully convey the invention to those skilled in the art.

Example 1

Polymerizing Si-Containing Polymer (1)

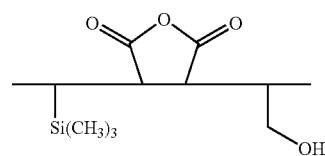
(1)

1.6 g (16 mmol) of vinyltrimethylsilane (obtained from Aldrich Chemical), 2.0 g (20 mmol) of maleic anhydride, 0.23 g (4 mmol) of allyl alcohol, and 5 mol % of azobisisobutyronitrile (AIBN) were dissolved in 8 ml of anhydrous THF in a round bottom flask and then purged using nitrogen gas. The resulting mixture was then polymerized under nitrogen at about 65° C. for 24 hours.

After polymerization, the polymerized materials were slowly precipitated in an excess amount of a solution of 2:1 mixture of n-hexane:IPA, and then, the obtained precipitates were dried at about 50° C. for about 24 hours in a vacuum oven. The calculated polymerization yield was 45% and produced a polymer distribution having a weight average molecular weight (Mw) of 6,700 daltons and a polydispersity (Mw/Mn) of 2.0.

Example 2

Polymerizing Si-Containing Polymer (2)

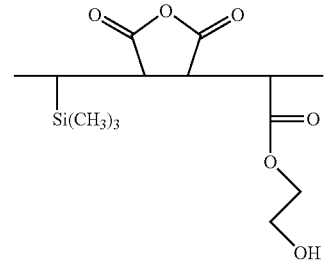
(2)

2.0 g (20 mmol) of vinyltrimethylsilane (obtained from Aldrich Chemical), 2.0 g (20 mmol) of maleic anhydride, 0.6 g (5 mmol) of 2-hydroxyethyl acrylate, and 4 mol % of AIBN were dissolved in 10 ml of anhydrous THF in a round bottom flask and then purged using nitrogen gas. The resulting mixture was then polymerized under nitrogen at about 65° C. for 24 hours.

After polymerization, the polymerized materials were slowly precipitated in an excess amount of a solution of 3:1 mixture of n-hexane:IPA. The precipitates recovered were then dried at about 50° C. for about 24 hours in a vacuum oven. The calculated polymerization yield was 35% and produced a polymer distribution having a weight average molecular weight (Mw) of 7,600 daltons and a polydispersity (Mw/Mn) of 2.0.

Example 3

Polymerizing Si-Containing Polymer (3)

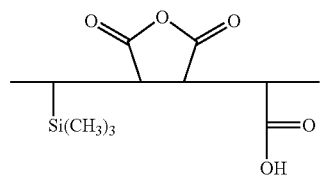
(3)

2.0 g (20 mmol) of vinyltrimethylsilane (obtained from Aldrich Chemical), 2.0 g (20 mmol) of maleic anhydride, 0.15 g (2 mmol) of acrylic acid, and 4 mol % of AIBN were dissolved in 8 ml of anhydrous THF in a round bottom flask and then purged using nitrogen gas. The resulting mixture was then polymerized at about 65° C. for 24 hours.

After polymerization, the polymerized materials were slowly precipitated in an excess amount of a solution of 2:1 mixture of n-hexane:IPA after which the obtained precipitates were dried at about 50° C. for about 24 hours in a vacuum oven. The calculated polymerization yield was 35% and produced a polymer distribution having a weight average molecular weight (Mw) of 7,200 daltons and a polydispersity (Mw/Mn) of 2.0.

Example 4

Polymerizing Si-Containing Polymer (4)

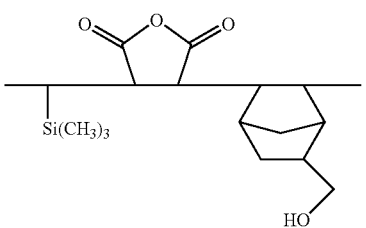
(4)

1.5 g (15 mmol) of vinyltrimethylsilane (obtained from Aldrich Chemical), 2.0 g (20 mmol) of maleic anhydride, 0.7 g (5 mmol) of 5-norbornene-2-methanol, and 5 mol % of AIBN were dissolved in 8 ml of anhydrous THF in a round bottom flask and then purged using nitrogen gas. The resulting mixture was then polymerized under nitrogen at about 65° C. for 24 hours.

After polymerization, the polymerized materials were slowly precipitated in an excess amount of a solution of 1:1 mixture of n-hexane:IPA. The precipitates recovered were dried at about 50° C. for about 24 hours in a vacuum oven. The calculated polymerization yield was 40% and produced a polymer distribution having a weight average molecular weight (Mw) of 6,600 daltons and a polydispersity (Mw/Mn) of 2.0.

Example 5

Polymerizing Si-Containing Polymer (5)

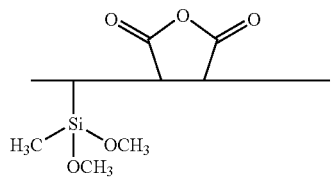

(5)

2.6 g (20 mmol)) of dimethoxymethylvinylsilane (obtained from Aldrich Chemical), 2.0 g (20 mmol) of maleic anhydride, and 5 mol % of AIBN were dissolved in 9 ml of anhydrous THF in a round bottom flask, and then, purged using nitrogen gas. The resulting mixture was polymerized under nitrogen at about 65° C. for 24 hours.

After polymerization, the polymerized materials were slowly precipitated in an excess amount of n-hexane solution, after which the precipitates obtained were dried at about 50° C. for about 24 hours in a vacuum oven. The calculated polymerization yield was 55% and produced a polymer distribution having a weight average molecular weight (Mw) of 6,900 daltons and a polydispersity (Mw/Mn) of 2.0.

Example 6

Barrier Characteristics of Barrier Coating Layer (1)

A photoresist layer was formed on a substrate and a barrier coating layer formed on the photoresist layer using a barrier coating composition according to an example embodiment of the invention for evaluating the characteristics of the barrier coating layer. A simulated immersion photolithography exposure process was then conducted by immersing the coated substrates in 25° C. deionized water for 60 seconds, dry-exposing the coated substrates, and then again immersing the coated and exposed substrates in 25° C. deionized water for 60 seconds. This simulated immersion photolithography exposure process was used for evaluating each of the other examples described below unless different conditions are specifically noted.

An anti-reflective coating (ARC) material (AR 46™ manufactured by Rohm-Hass) configured for an exposure wavelength of 193 nm layer was formed on an 8-inch (20.3 cm) diameter bare silicon wafer, and then baked to form an ARC layer with a thickness of about 290 Å. A quantity of a photoresist composition (RHR3640™ manufactured by ShinEstu) used for an exposure wavelength of 193 nm was dispensed onto the ARC layer and distributed across the surface of the ARC layer using a spin-coating technique. The resulting layer of the photoresist composition was then baked at 110° C. for 60 seconds to obtain a photoresist layer with a thickness of about 1800 Å.

1 g of polymeric material prepared according to Example 1 was dissolved in 50 g of isopropyl alcohol and then filtered using a 0.2 µm membrane filter to form a barrier coating composition according to an example embodiment of the invention. This barrier coating composition was then applied to the upper surface of the photoresist layer using a spin-coating technique. The resulting layer was then heat-treated at about 90° C. for about 60 seconds to form a barrier coating layer with a thickness of about 400 Å.

The surface of the coated wafer was then soaked in 25° C. deionized water for 60 seconds, exposed to various exposure doses using an ArF excimer laser light source in an AMSL1100 ArF scanner (NA=0.75 annular and σ=0.85/0.55), soaked in 25° C. deionized water for another 60 seconds, subjected to PEB at 120° C. for 90 seconds, and then developed with a 250° C. 2.38% tetramethylammonium hydroxide (TMAH) solution for 60 seconds. Fine line and space patterns (L/S patterns) having vertical or substantially vertical walls without T-top profiles, i.e., the top portion of the resist lines did not overhang a lower portion, were obtained using a range of exposure doses from 21 to 27 mJ/cm$^2$ as illustrated in the SEM images reproduced in FIG. 2.

Example 7

Barrier Characteristics of Barrier Coating Layer (2)

Using the same conditions as in Example 6, L/S patterns were formed on silicon wafers, with the exception that 1 g of the polymeric material prepared according to Example 2 was dissolved in 50 g of 4-methyl-2-pentanol, and then filtered using a 0.2 µm membrane filter, to form another example embodiment of a barrier coating composition according to the invention.

FIG. 3 shows SEM images of L/S patterns of various doses, according to another embodiment of the invention. As illustrated in FIG. 3, clean L/S patterns having various line widths obtained with exposure doses of from 21 to 27 mJ/cm$^2$.

Figure 4:
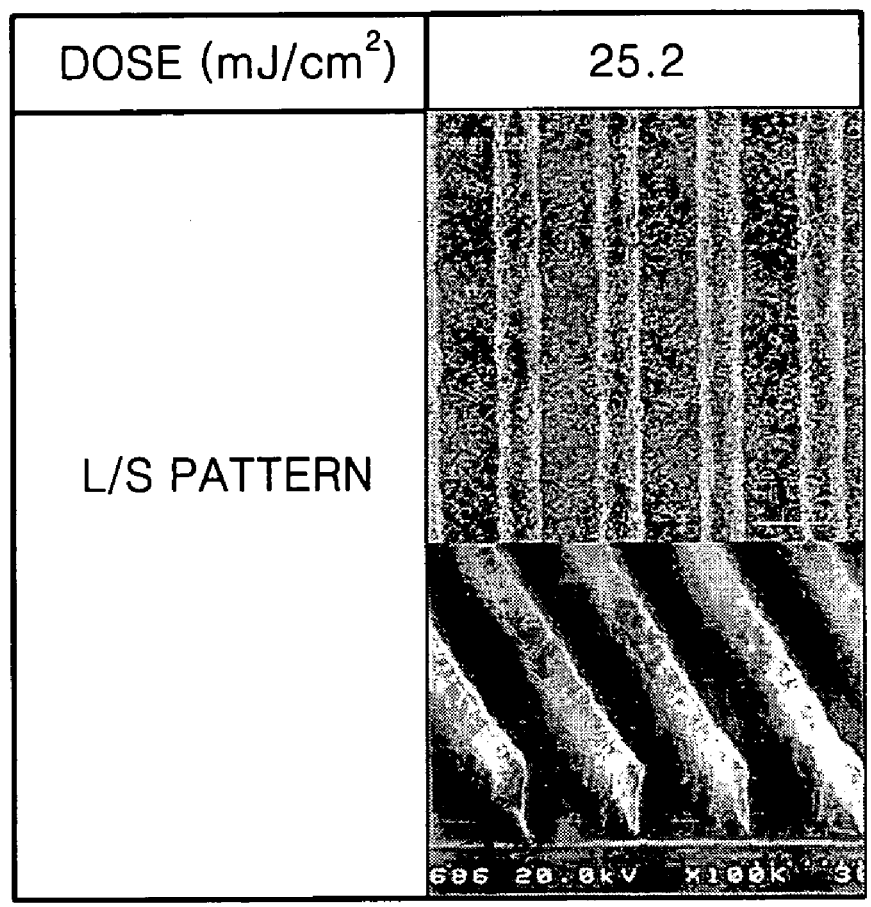
FIG. 4 shows a SEM image of top and vertical profiles of a L/S pattern obtained using the method according to another example embodiment of the invention.

FIG. 4 shows top and vertical profiles of L/S patterns when photoresist patterns are formed using the same method as in Example 7 with the exception that the exposure dose was 25.2 mJ/cm$^2$. As illustrated in FIG. 4, a clean L/S pattern having vertical walls without T-tops profile was obtained.

Example 8

Barrier Characteristics of Barrier Coating Layer (3)

Using the same conditions as in Example 6, L/S patterns were formed on silicon wafers, except that 1 g of the polymeric material prepared according to Example 3 was dissolved in 50 g of 4-methyl-2-pentanol, and then filtered using a 0.2 µm membrane filter, to form another example embodiment of a barrier coating composition according to the invention.

As a result, a clean L/S pattern having a photoresist profile exhibiting vertical or substantially vertical walls without T-tops was obtained with an exposure dose of 24 mJ/cm$^2$. The width of the line was 90 nm.

Example 9

Barrier Characteristics of Barrier Coating Layer (4)

Using the same conditions as in Example 6, L/S patterns were formed on silicon wafers, except that 1 g of the polymer according to the Example 4 was dissolved in 50 g of 4-methyl-2-pentanol, and then filtered using a 0.2 μm membrane filter, to form another example embodiment of barrier coating composition according to the invention.

As a result, a clean L/S pattern having a photoresist profile exhibiting vertical or substantially vertical walls without T-tops was obtained with an exposure dose of 25 mJ/cm². The width of the line was 90 nm.

Example 10

Barrier Characteristics of Barrier Coating Layer (5)

Using the same conditions as in Example 6, L/S patterns were formed on silicon wafers, except that 1 g of the polymer according to the Example 5 was dissolved in 50 g of 4-methyl-2-pentanol, and then filtered using a 0.2 μm membrane filter, to form another example embodiment of barrier coating composition according to the invention.

As a result, a clean L/S pattern having a photoresist profile exhibiting vertical or substantially vertical walls without T-tops was obtained using an exposure dose of 24 mJ/cm². The width of the line was 90 nm.

Barrier coating compositions according to example embodiments of the invention include a first monomer or monomer that incorporates silicon and may include a second monomer or monomer, for example, a maleic anhydride. The silicon containing monomer provide increased hydrophobicity to the barrier coating composition. Accordingly, when a barrier coating layer formed using a composition according the example embodiments of the invention is used during immersion photolithography, the barrier coating layer prevents or suppresses dissolution of soluble components from the underlying photoresist layer in the liquid medium. Light energy of an appropriate wavelength, however, can pass through the barrier coating layer in order to expose the underlying photoresist layer during immersion photolithography processes.

Barrier coating compositions and methods of forming barrier coating layers according to the example embodiments of the invention also reduce or eliminate intermixing of the barrier coating composition and the photoresist layer along the boundary or interface formed between the two layers. The barrier coating layers formed using the barrier coating compositions according to example embodiments of the invention will also exhibit increased solubility in a developing solution, thereby allowing the barrier coating layer to be removed using a conventional photoresist developing process.

Accordingly, the use of barrier coating compositions and barrier coating layers according to example embodiments of the invention can be incorporated in semiconductor fabrication processes for forming fine photoresist patterns that exhibit good resist profiles, e.g., vertical or substantially vertical patterns that do not include enlarged or T-top regions in the upper portions of photoresist pattern while reducing manufacturing costs through the use of less expensive materials and without adding complicated or difficult processing steps.

While the invention has been particularly shown and described with reference to example embodiments thereof, it will be understood by those of ordinary skill in the art that various changes in form and details may be made therein without departing from the spirit and scope of the invention as defined by the following claims.

What is claimed is:

1. A barrier coating composition comprising:
    a polymer having a weight average molecular weight (Mw) of 5,000 to 200,000 daltons; and
    an organic solvent,
    wherein the polymer corresponds to formula I:

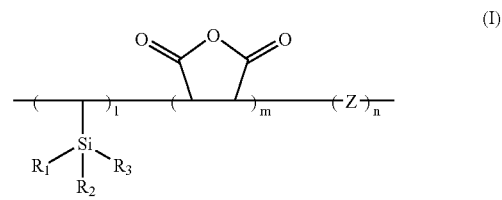

(I)

wherein each of the expressions (1+m+n)=1; $0.1 \leq (1/(1+m+n)) \leq 0.7$; $0.3 \leq (m/(1+m+n)) \leq 0.9$; and $0.0 \leq (n/(1+m+n)) \leq 0.6$ is satisfied;
    wherein $R_1$, $R_2$ and $R_3$ are independently selected from a group consisting of $C_1$ to $C_5$ alkyls, $C_1$ to $C_5$ alkoxy and hydroxyl groups and mixtures thereof; and
    wherein Z is an alkene monomer that includes a hydrophilic group.

2. The barrier coating composition according to claim 1, wherein:
    $R_1$, $R_2$ and $R_3$ are methyl groups.

3. The barrier coating composition according to claim 1, wherein:
    each of $R_1$, $R_2$ and $R_3$ is selected from a group consisting of methyl and methoxy groups and
    at least one of $R_1$, $R_2$ and $R_3$ is a methyl group.

4. The barrier coating composition according to claim 1, wherein:
    the expression $0.0<(n/(1+m+n)) \leq 0.6$ is satisfied; and
    the hydrophilic group is selected from a group consisting of alcohol and acid groups and mixtures thereof.

5. The barrier coating composition according to claim 1, wherein:
    Z is selected from the group consisting of (meth)acrylates, cycloalkenes, (meth)acrylic acids and mixtures thereof.

6. The barrier coating composition of claim 1, wherein:
    Z is selected from a group consisting of 2-hydroxyethyl (meth)acrylate, allyl alcohol, 5-norbornene-2-methanol and mixtures thereof.

7. The barrier coating composition according to claim 1, wherein:
    the organic solvent includes a $C_3$ to $C_{10}$ alcohol-based organic solvent.

8. The barrier coating composition according to claim 1, wherein:
    the organic solvent is a mixture of a $C_3$ to $C_{10}$ alcohol-based organic solvent and a $C_4$ to $C_{12}$ alkane-based organic solvent.

9. A method of forming a photoresist pattern, comprising:
    forming a photoresist layer on a substrate;
    forming a barrier coating layer on an upper surface of the photoresist layer using a barrier coating composition which includes a polymer having a weight average molecular weight (Mw) of 5,000 to 200,000 daltons, and an organic solvent, wherein the polymer corresponds to formula I:

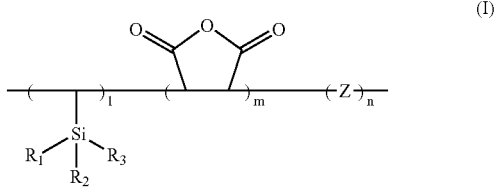

(I)

wherein each of the expressions $(1+m+n)=1$; $0.1 \leq (1/(1+m+n)) \leq 0.7$; $0.3 \leq (m/(1+m+n)) \leq 0.9$ and $0.0 \leq (n/(1+m+n)) \leq 0.6$ is satisfied;

wherein $R_1$, $R_2$ and $R_3$ are independently selected from a group consisting of $C_1$ to $C_5$ alkyl, $C_1$ to $C_5$ alkoxy and hydroxyl groups and mixtures thereof; and wherein Z is an alkene derivative that includes a hydrophilic group;

exposing a region of the photoresist layer to light energy through the barrier coating layer and an immersion medium disposed on the barrier coating layer to form an exposed photoresist layer;

removing the barrier coating layer; and developing the exposed photoresist layer.

10. The method of forming a photoresist pattern according to claim 9, wherein forming of the barrier coating layer includes:

applying a quantity of the barrier coating composition to the upper surface of the photoresist layer;

spinning the substrate at a spin rate sufficient to distribute the barrier coating composition across the upper surface of the photoresist layer; and heating the distributed barrier coating composition to form the barrier coating layer.

11. The method of forming a photoresist pattern according to claim 10, wherein:

the spin rate is from 500 to 3000 rpm and the barrier coating layer has a thickness from 200 Å to 800 Å.

12. The method of forming a photoresist pattern according to claim 10, wherein:

the barrier coating composition is heated to a temperature of 95° C. to 120° C.

13. The method of forming a photoresist pattern according to claim 9, wherein removing of the barrier coating layer and the developing of the exposed photoresist layer include:

applying a removing solution to an upper surface of the barrier coating layer; and applying a developing solution to exposed photoresist layer.

14. The method of forming a photoresist pattern according to claim 13, wherein:

the removing solution and the developing solution are alkaline solutions having identical compositions.

15. The method of forming a photoresist pattern according to claim 9, wherein:

the light energy has a wavelength of 248 nm or 193 nm.

16. The method of forming a photoresist pattern according to claim 9, wherein:

$R_1$, $R_2$ and $R_3$ are methyl groups.

17. The method of forming a photoresist pattern according to claim 9, wherein:

$R_1$, $R_2$ and $R_3$ are selected from a group consisting of methyl and methoxy groups; and $R_1$, $R_2$ and $R_3$ include at least one methyl group.

18. The method of forming a photoresist pattern according to claim 9, wherein:

the expression $0.0<(n/(1+m+n)) \leq 0.6$ is satisfied; and the hydrophilic group is selected from a group consisting of alcohol and acid groups and mixtures thereof.

19. The method of forming a photoresist pattern according to claim 9, wherein:

Z is selected from the group consisting of (meth)acrylates, cycloalkenes, (meth)acrylic acids and derivatives and mixtures thereof.

20. The method of forming a photoresist pattern according to claim 9, wherein:

Z is selected from the group consisting of 2-hydroxyethyl (meth)acrylate, allyl alcohol, 5-norbornene-2-methanol and mixtures thereof.

21. The method of forming a photoresist pattern according to claim 9, wherein:

the organic solvent is selected from a group consisting of $C_3$ to $C_{10}$ alcohol-based organic solvents, a solvent system including a plurality of $C_3$ to $C_{10}$ alcohol-based organic solvents, $C_4$ to $C_{12}$ alkane-based organic solvents and a solvent system including a plurality of $C_4$ to $C_{12}$ alkane-based organic solvents.

22. The method of forming a photoresist pattern according to claim 9, wherein:

the organic solvent is a solvent system includes a $C_3$ to $C_{10}$ alcohol-based organic solvent and a $C_4$ to $C_{12}$ alkane-based organic solvent.

* * * * *